(12) United States Patent
Hembd

(10) Patent No.: US 7,755,833 B2
(45) Date of Patent: Jul. 13, 2010

(54) CORRECTING DEVICE TO COMPENSATE FOR POLARIZATION DISTRIBUTION PERTURBATIONS

(75) Inventor: Christian Hembd, Goeppingen-Faurndau (DE)

(73) Assignee: Carl Zeiss SMT AG, Oberkochen (DE)

( * ) Notice: Subject to any disclaimer, the term of this patent is extended or adjusted under 35 U.S.C. 154(b) by 826 days.

(21) Appl. No.: 10/562,577

(22) PCT Filed: Jun. 17, 2005

(86) PCT No.: PCT/EP2004/006504
§ 371 (c)(1), (2), (4) Date: Nov. 9, 2006

(87) PCT Pub. No.: WO2005/001527
PCT Pub. Date: Jan. 6, 2005

(65) Prior Publication Data
US 2007/0183017 A1 Aug. 9, 2007

(30) Foreign Application Priority Data
Jun. 27, 2003 (DE) .......................... 103 28 938

(51) Int. Cl.
*G02B 5/30* (2006.01)
(52) U.S. Cl. .................. 359/489; 359/497; 359/499; 359/500
(58) Field of Classification Search ........................ None
See application file for complete search history.

(56) References Cited
U.S. PATENT DOCUMENTS
3,663,087 A 5/1972 Guillet et al.
4,643,534 A * 2/1987 Chun et al. ............ 359/249
6,104,472 A 8/2000 Suzuki
6,252,712 B1 6/2001 Furter et al.
6,262,793 B1 7/2001 Sasaya et al.
2004/0105170 A1 6/2004 Krahmer et al.
2004/0150806 A1 8/2004 Brunotte et al.

FOREIGN PATENT DOCUMENTS
EP 0937999 8/1999
JP 05045519 A 2/1993
WO WO 03/038479 A2 10/2002

* cited by examiner

*Primary Examiner*—Arnel C Lavarias
(74) *Attorney, Agent, or Firm*—Sughrue Mion, PLLC

(57) ABSTRACT

A corrective device for compensating disturbances of polarization distribution across the cross section of a light beam (10). The corrective device includes a corrective member (18; 118) encompassing two double refractive corrective elements (20, 22; 120a, 120b, 122; 220; 222; 320, 322) with two substantially parallel surfaces (24, 26; 126, 127). The thickness (d) of the corrective element (22; 122, 222) is essentially constant between the surfaces (26; 126, 127). At least one of the surfaces (24, 26; 126, 127) of at least one of the corrective elements (20, 22; 120a, 120b, 122; 220; 222; 320, 322) is refinished in such a way that local irregularities in thickness Δd are created, by which the disturbances of polarization distribution are at least nearly compensated. The arrangement, thickness (d), and double-refractive properties of the corrective elements (20, 22; 120a, 120b, 122; 220; 222; 320, 322) are selected such that the double-refractive effects thereof mutually cancel each other out if the local irregularities in thickness Δd are not taken into consideration. The corrective device influences polarization only at points where disturbances are to be compensated.

10 Claims, 3 Drawing Sheets

CORRECTING DEVICE TO COMPENSATE FOR POLARIZATION DISTRIBUTION PERTURBATIONS

CROSS-REFERENCE TO RELATED APPLICATIONS

This is a National Stage of International Application No. PCT/EP2004/006504 filed Jun. 17, 2004, and claiming priority of German patent application DE 103 28 938.0. The full disclosure of the International Application is hereby incorporated herein by reference.

BACKGROUND OF THE INVENTION

1. Field of the Invention

The invention relates to a correcting device to compensate for perturbations of the polarization distribution over the cross section of a light beam in an optical system, for example a projection objective for a microlithographic projection exposure apparatus.

2. Description of Related Art

A correcting device and a projection objective of this type are known from DE 198 07 120 A1 (the U.S. counterpart of which is patented as U.S. Pat. No. 6,252,712 to Fuerter et al.).

In many optical systems, a prerequisite for a high imaging quality is that the light passing through the optical system should be in a defined polarization state everywhere over the beam cross section. Since this defined polarization state need not be constant over the beam cross section, the term "defined polarization distribution of the light" is also often employed. If deviations from this defined polarization distribution occur, then this can lead to intolerable imaging errors and/or contrast losses in the image plane. Examples of relevant causes of such deviations are the polarization dependency of reflective layers or the birefringence of particular lens materials.

The latter point is of particular importance in connection with microlithographic projection exposure apparatus, such as those used for the production of large-scale integrated electrical circuits. In that case, it is becoming increasingly common to use lenses made of fluorspar ($CaF_2$) since these crystals still have a sufficient optical transparency even at very short projection light wavelengths. At very short wavelengths, however, fluorspar is by its very nature (i.e. intrinsically) birefringent; birefringence due to mechanical stresses may furthermore be added to this. Although various measures for reducing the birefringence of fluorspar lenses are now known, full compensation for perturbations of the polarization distribution over the cross section of the projection light beam is nevertheless generally impossible. If these perturbations remain uncompensated, then the contrast of the projection objectives is reduced, and this has an unfavorable effect on the size of the structures that can then be produced with such apparatus.

The fact that the polarization distribution perturbations considered here have the property of varying over the cross section of a light beam precludes compensation by conventional polarization compensators, for example a Soleil-Babinet compensator, since these compensators act uniformly over the cross section of the light beam.

German Publication DE 198 07 120 A1 discloses a correcting device to compensate for polarization perturbations which vary locally over the cross section of a light beam. The correcting device described therein comprises a plate, which consists of magnesium fluoride ($MgF_2$) and is therefore birefringent, introduced into the beam path of the optical system. The thickness of the plate varies over its cross section, which leads to a position-dependent compensating effect. Since the thickness variations required for the compensation amount only to a few micrometers, the freeform surfaces on the plate cannot be produced by polishing or other conventional methods of material erosion. Production of the freeform surfaces by means of ion beam processing is therefore proposed. Such processing methods are used, for example, in the production of so-called "nano-aspheres" which are used to correct wavefront errors in projection exposure apparatus.

In order to compensate for a class of polarization perturbations which is as general as possible, it is proposed to use two such plates whose principal axes are mutually rotated by 45°. Since the thickness variations affect not only the polarization but also, to an even greater extent, the wavefront profile of light passing through, each of the correcting plates is provided with a quartz plate for wavefront compensation, which also have thickness variations but ones which are complementary with those of the correcting plates. When taken together, a correcting plate and its associated quartz plate, which are assembled together seamlessly by contact bonding or cementing, have scarcely any effect on the wavefront profile of transmitted light because their refractive indices are approximately equal.

A disadvantage with this known correcting device, however, is that the correcting plates do not only influence the polarization where perturbations are to be compensated for, but change the polarization over the entire cross section of the light beam. This is because the correcting plates cannot comprise birefringent material exclusively where compensation for polarization distribution perturbations is required. In that case, the correcting plates would need to be only a few micrometers thick and also have holes at the positions where no perturbations are to be compensated for. Such correcting plates would be neither producible nor manageable. The correcting plates must therefore comprise additional material, which acts as a kind of support but also contributes to the influence on the polarization over its entire cross section.

SUMMARY OF THE INVENTION

It is an object of the invention to improve a correcting device of the type mentioned in the introduction, so that the polarization of light passing through is influenced in the controlled way only where perturbations of the polarization distribution need to be compensated for.

This object is achieved in that at least one correcting component comprises at least one further birefringent correcting element, which is assigned to the first correcting element and has two essentially parallel surfaces, in that at least one of the surfaces of at least one of the correcting elements is reprocessed so as to create local thickness variations $\Delta d$ by which the perturbations of the polarization distribution are compensated for at least approximately, and in that the arrangement, thickness and birefringence properties of the correcting elements are selected so that their birefringent effects cancel each other out when the local thickness variations are neglected.

The invention is based on the discovery that, if their birefringence axes are mutually oriented in a suitable way, then a plurality of birefringent elements can cancel out their birefringent effects. The invention is thus firstly based on an arrangement of two or more birefringent correcting elements which, taken together, do not influence the polarization of light passing through. If the thickness now varies locally on one or more of these correcting elements, then the birefringent effect of the overall arrangement is restricted only to those regions where thickness modifications have been carried out. If the correcting elements consist of the same birefringent material, then, apart from the thickness variations introduced by subsequent processing, they must have the same thickness so that full mutual compensation of their birefringent effects takes place.

In a correcting component which consists of two correcting elements, these may for example be arranged in the correcting device with birefringence axes mutually rotated by 90°. In the case of three correcting elements, a relative orientation of the birefringence axes at 120° angles may be envisaged.

In a preferred configuration of the invention, the surfaces of the correcting elements are reprocessed complementarily with one another so that the total thickness of all the correcting elements of a correcting component is constant over its cross section. Since the correcting component as a whole does not have any thickness variations, wavefront errors are substantially avoided. This applies even if the individual correcting elements are not fastened directly to one another but are arranged at a distance from one another in the correcting device. If the correcting elements are flat disks, for example, then the overall correcting component acts as a plane-parallel plate which still locally influences the polarization but does not significantly influence the profile of the wavefront. Additional quartz plates, which are necessary in the prior art in order to equalize the optical path differences due to the thickness variations, can therefore be obviated.

In this configuration, it is furthermore advantageous that the local thickness variation required for the perturbation compensation at a particular point is thereby necessarily distributed between a plurality of correcting elements. If the correcting component comprises two correcting elements, for example, then the complementary reprocessing of the surfaces leads to a local thickness variation $\Delta d$ being distributed between the two correcting elements so that the thickness of one correcting element is reduced by $\Delta d/2$ at the corresponding point, and that of the other correcting element is increased by $\Delta d/2$. Distributing the thickness variations between a plurality of correcting elements is advantageous particularly in the case of large thickness variations, since these can be accurately produced only with significant difficulties by the known reprocessing methods such as ion or atom beam etching.

Ideally, the correcting device should locally influence only the polarization, but not otherwise modify the light propagation in the optical system in which the correcting device is installed. This being the case, for ray bundles with a small aperture angle it will generally be sufficient to produce the correcting elements as plane-parallel plates, the size of which can be adapted to the geometry of the light beam passing through. For light beams with larger aperture angles, however, correcting elements with curved, for example spherical, surfaces may also be envisaged.

One application of this involves catadioptric projection objectives, which generally contain a spherical imaging mirror arranged in a pupil plane. In order to arrange the correcting device as close as possible to a pupil surface, and therefore in the immediate vicinity of the curved mirror surface, adaptation of the surface of the correcting elements to the mirror curvature is virtually unavoidable. It is generally preferable to arrange the correcting device in a pupil plane because it will then have a field-independent effect, so that an average polarization error in the field can be adopted as the correction quantity.

Even with a total thickness of all the correcting elements which is constant over the cross section, however, slight wavefront errors due to the thickness variations of the individual correcting elements are not entirely avoidable. For this reason, it may be expedient for at least one correcting element to have a surface which is additionally reprocessed so as to reduce wavefront errors due to the thickness variations.

With only one correcting component, it is not possible to compensate for all types of polarization perturbations. Two correcting components are therefore provided in a preferred configuration of the invention, the birefringence axes of the correcting elements of one correcting component being rotated by 45° relative to the birefringence axes of the correcting elements of the other correcting component. In this way, it is possible to compensate not only for phase shifts but also for rotations of the polarization.

BRIEF DESCRIPTION OF THE DRAWINGS

Exemplary embodiments of the invention will be explained below with reference to the drawings, in which.

DESCRIPTION OF THE PREFERRED EMBODIMENTS

Figure 1:
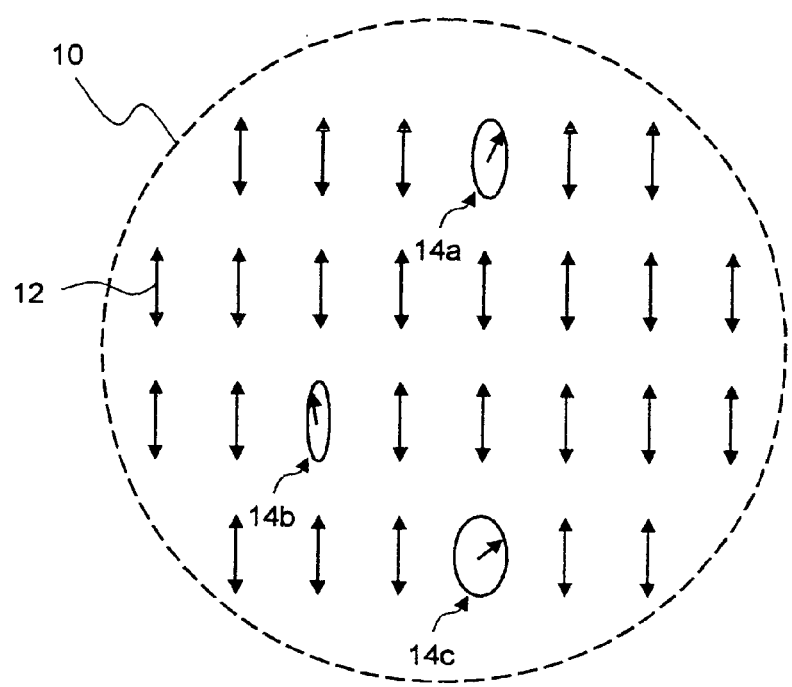
FIG. 1 shows a highly simplified representation of the polarization distribution over the cross section of a light beam.

FIG. 1 shows a cross section through a light beam 10, in which a polarization distribution is schematically indicated with the aid of arrows 12. The arrows 12 are intended to represent the polarization direction inside the light beam 10. As can be seen in FIG. 1, the light is mostly polarized linearly with the same polarization direction over the cross section of the light beam 10. At a few points which are denoted by 14a, 14b and 14c in FIG. 1, however, the light is polarized not exactly linearly but more or less elliptically. These perturbations of the polarization distribution may lead, in subsequent polarization-selective optical elements such as beam-splitter layers or retardation plates, to intolerable imaging errors and/or to a contrast loss in the image plane.

Figure 2:
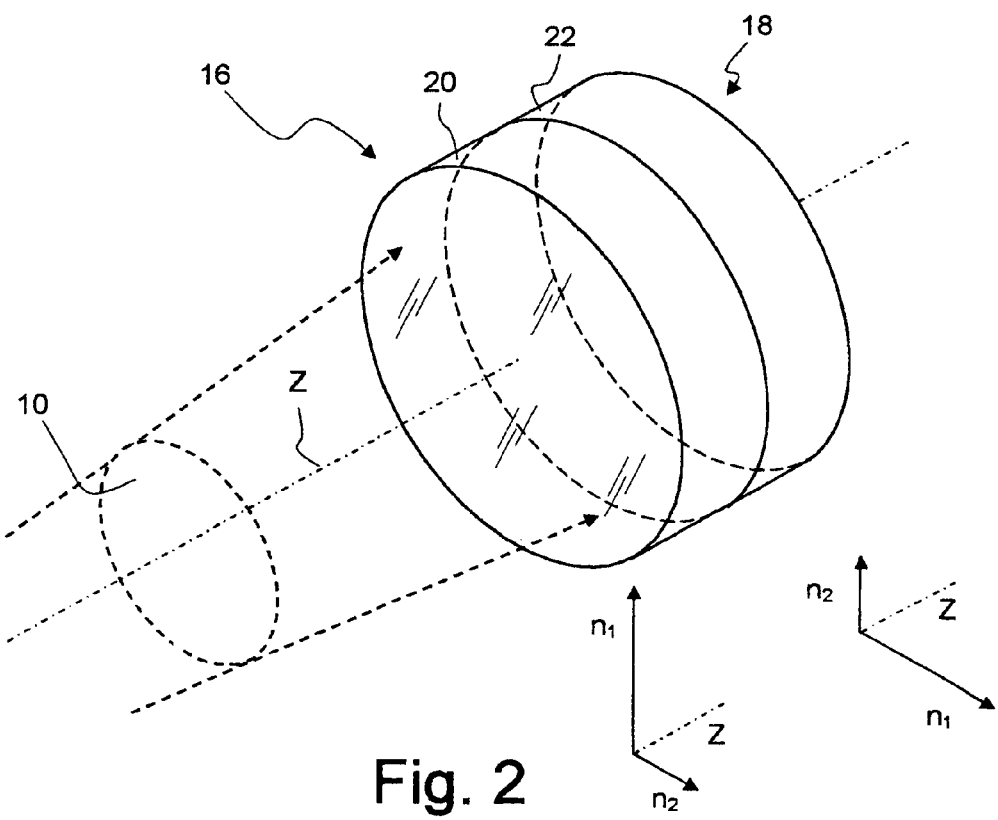
FIG. 2 shows a perspective representation, not true to scale, of a correcting device according to the invention having two correcting elements, through which a light beam passes.

In a perspective representation which is not true to scale, FIG. 2 shows a correcting device 16 with which it is possible to compensate for the perturbations 14a, 14b and 14c in the polarization distribution of the light beam 10. Besides frame elements (not shown in FIG. 2), the correcting device 16 comprises a correcting component 18 which in turn comprises a first and a second disk-shaped correcting element 20 and 22, respectively, which are assembled together seamlessly. The two correcting elements 20, 22 are made of magnesium fluoride crystals ($MgF_2$), and are therefore birefringent. Magnesium fluoride is suitable particularly for applications in microlithography, since it is still transparent even at the wavelengths of 193 nm or 157 nm used therein.

The orientation of the crystal axes is selected so as to create the birefringence axes, represented by axis intersections in FIG. 2, for the two correcting elements 20, 22. The slow crystal axis with the higher refractive index $n_1$ and the fast crystal axis with the lower refractive index $n_2$ are respectively perpendicular to each other and furthermore perpendicular to the optical axis of the correcting device 16, which is denoted by Z.

This means that in the first correcting element 20, a polarization component of the light beam 10 which extends along the slow crystal axis will experience a phase change Φ, also referred to as retardation, relative to the polarization component perpendicular to it, which is given by $$\Phi = (2\pi/\lambda) \cdot d \cdot (n_1 - n_2).$$

Here, λ denotes the wavelength of the light incident on the correcting component 18 and d denotes the thickness of the correcting element 20 along the optical axis Z.

In the second correcting element 22, however, the polarization component perpendicular thereto will be retarded since the crystal orientations of the correcting elements 20, 22, and therefore their birefringence axes, are mutually rotated by 90° about the Z axis. Since the two correcting elements 20, 22 have the same thickness, the magnitude of the phase differences is the same. In this way, the phase change of one polarization component due to the first correcting element 20 is compensated for by an equally large phase change of the polarization component perpendicular to it, which is caused by the second correcting element 22. Wherever the thicknesses of the two correcting elements 20, 22 are exactly equal, the relative phase angle between mutually perpendicular polarization components, and therefore the polarization state of the light passing through, will consequently not change.

In order now to compensate for the polarization distribution perturbations schematically shown in FIG. 1, the thicknesses of the two correcting elements 20, 22 are deliberately selected so that they differ at suitably selected points over the cross section.

Figure 3:
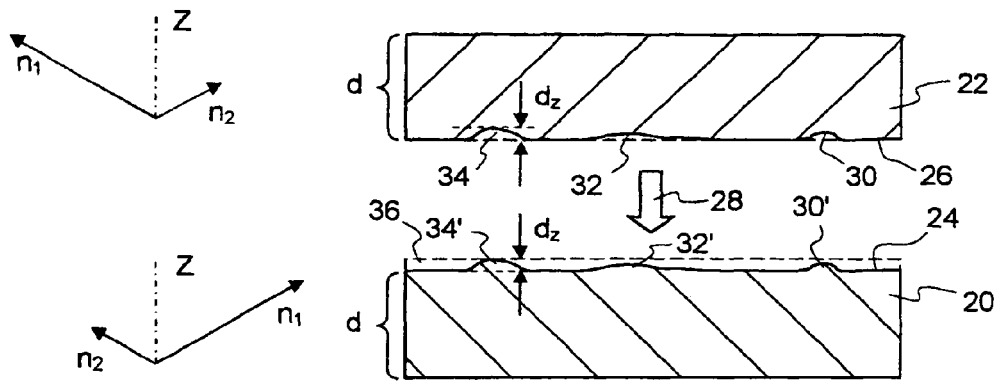
FIG. 3 shows a cross section through the correcting elements shown in FIG. 2, before they are assembled together.

FIG. 3 shows a cross section through the two correcting elements 20, 22 before they are assembled together. In a highly exaggerated representation, structures can be seen on the mutually opposing surfaces 24 and 26 of the two correcting elements 20, 22, which lead to thickness variations and are formed complementarily with each other. This means that each elevation on one surface has an indentation corresponding to it on the opposite surface, and that the corresponding elevations and indentations are designed so that they engage exactly in one another when the two correcting elements 20, 22 are assembled together. Assembling the two correcting elements 20, 22 together, as indicated by an arrow 28, then leads to the correcting component 18 shown in FIG. 4, which consists of a material block having a uniform total thickness $d_g$ and containing no cavities.

As can be seen in FIG. 3, when the thickness variations are neglected, the two correcting elements 20, 22 have the same thickness d in order to achieve the basic compensation of the phase changes as explained above with reference to FIG. 2. A plurality of indentations 30, 32 and 34 have been subsequently made on the surface 26 of the second correcting element 22 by ion beam etching or similar suitable processing methods, in order to compensate for a perturbation of the polarization distribution at this position. The opposite surface 24 of the first correcting element 20 has corresponding elevations 30', 32' and 34', the shape of which corresponds exactly to that of the opposite indentations. The elevations 30', 32' and 34' are generated by initially producing the first correcting element 20 with an extra thickness 36, indicated by dashes, so that the elevations 30', 32' and 34' can be exposed by subsequent erosion of material around them.

It is to be understood that the categorization carried out here as indentations 30, 32 and 34, on the one hand, and elevations 30', 32' and 34', on the other hand, merely serves to simplify the representation. Whether the surface 26 of the second correcting element 22 is defined by the indentations 30, 32 and 34, or alternatively by elevations which lie between the indentations 30, 32 and 34, is merely a question of definition. Very generally, the surfaces 24, 26 of the correcting elements 20 and 22 may have a virtually arbitrary but mutually complementary unevenness.

The following procedure, for example, may be adopted in order to establish the position and extent of the thickness variations:

First, the polarization distribution is recorded by measurement techniques in an image plane of the optical system in which the correcting device 16 is installed. To this end, two orthogonal polarizations are successively set up in an object plane of the optical system, and the polarization state is respectively recorded in the image plane. The correction requirement is calculated from the difference between the measurement results as a function of the optical position of the correcting component 18. If the correcting component 18 lies in a pupil plane of the optical system, then the effect of the correcting component 18 is field-independent. It is therefore possible to use the average polarization error in the field as a correction quantity. If the phase difference between the two perpendicular polarization states as a function of the angle coordinates θ and φ of rays in the image plane is denoted by Φ(θ, φ), then the required thickness variation Δd of a correcting element at the position coordinates (x,y) is given by $$\Delta d(x,y) = \Phi(\theta,\phi) \cdot (\lambda/2\pi) \cdot 1/(n_1 - n_2).$$

Figure 4:
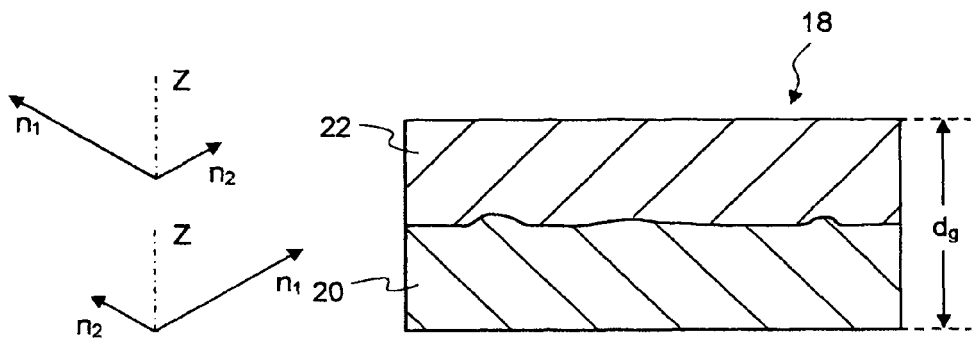
FIG. 4 shows a representation corresponding to FIG. 3, but after the correcting elements have been assembled together.

Since a thickness variation Δd(x,y) at a position (x,y) in the exemplary embodiment shown in FIGS. 2 to 4 is respectively distributed uniformly between the two correcting elements 20, 22, in order to keep the total thickness $d_g$ constant, this leads to an elevation or indentation respectively with a magnitude $d_z = \Delta d/2$ for the two correcting elements 20, 22 at the position (x,y). This quantity $d_z$, which in terms of production technology indicates the height of the required material erosion, will be referred to below as the profile depth. The fact that the profile depth is reduced by a factor of 2, relative to the required thickness variation Δd, has significant production technology advantages since achieving large profile depths sometimes presents difficulties with the previously known methods of high-accuracy material erosion.

FIG. 3 indicates the profile depth $d_z$ by way of example for the position with the greatest and smallest thickness of the correcting elements 20, 22, respectively. It can also be seen from this representation that the extra thickness 36 on the first correcting element 20 should be selected so that it is (at least) equal to the maximum profile depth, and therefore to half the maximum thickness variation Δd which is required for the perturbation compensation.

When the correcting element 16 is used in microlithography with wavelengths of 193 nm or 157 nm, the profile depths $d_z$ obtained in this way are of the order of a few hundred nanometers, while the thicknesses d of the disks are of the order of a few millimeters. The profile depths $d_z$ represented in FIG. 3 are therefore shown greatly exaggerated.

Figure 5:
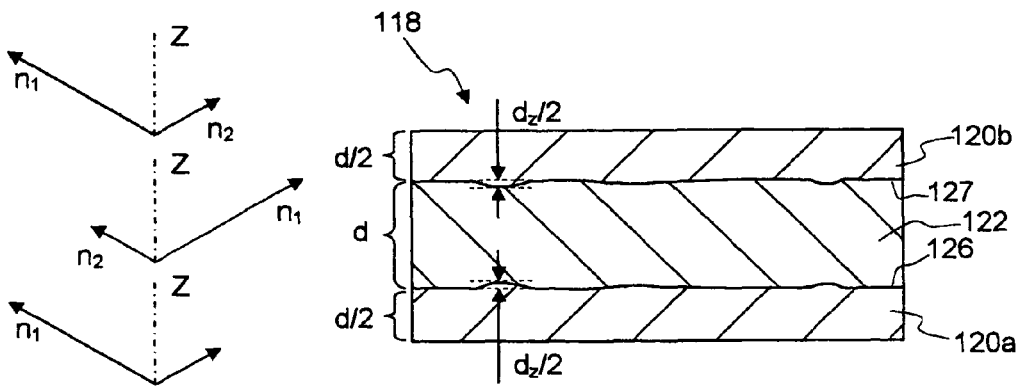
FIG. 5 shows a cross section through another exemplary embodiment of a correcting device according to the invention, having three correcting elements.

FIG. 5 shows another exemplary embodiment of a correcting device, which is denoted overall by 118. Parts which correspond to those of the exemplary embodiment shown in FIGS. 2 to 4 are provided with reference numerals increased by 100. The first correcting element in this exemplary embodiment is divided into two sub-elements 120a, 120b, which enclose the second correcting element 122 between them and whose total thickness corresponds to that of the second correcting element 122. The thickness variations Δd are divided here between two interfaces, which are established by the essentially parallel surfaces 126, 127 of the second correcting element 122. For each of these surfaces 126, 127, the profile depth is therefore halved again by a factor of 2 to $d_z/2=\Delta d/4$.

Figure 6:
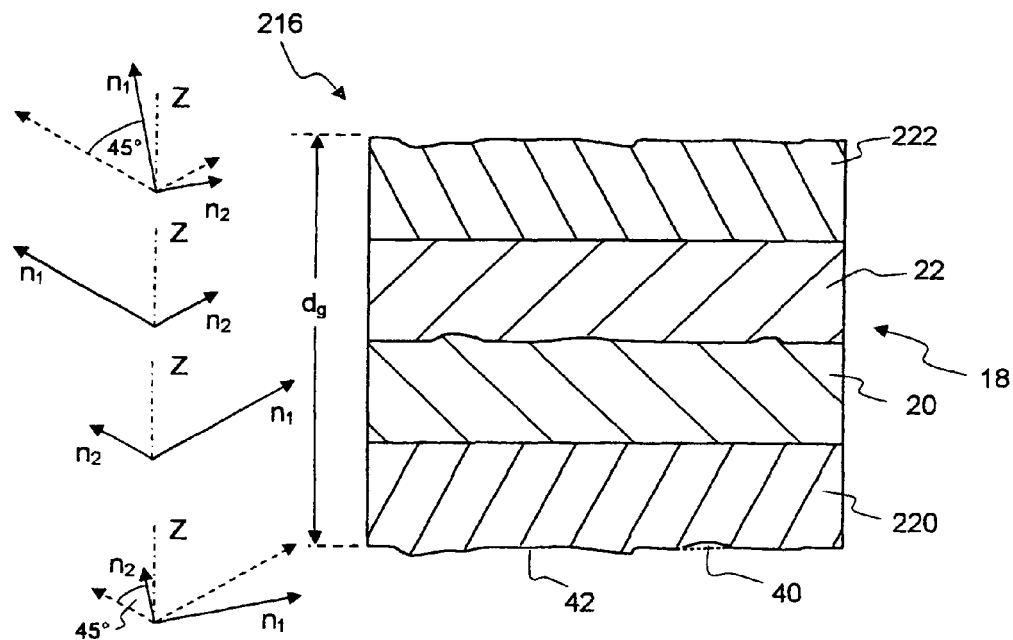
FIG. 6 shows a cross section through a further exemplary embodiment of a correcting device according to the invention, which comprises two correcting components each having two correcting elements.

FIG. 6 shows a further exemplary embodiment of a correcting device, which is denoted overall by 216, in a cross section. The correcting device 216 comprises, on the one hand, the correcting component 18 as shown in FIGS. 2 to 4. The correcting device 216 also contains two other correcting elements 220 and 222, which together form a further correcting component. As represented on the left next to the cross section, the orientations of the crystal axes of the two correcting elements 220 and 222 are derived by a 45° rotation from the crystal axes of the correcting elements 20 and 22, respectively. In the two outer correcting elements 220, 222, therefore, the fast crystal axes as well the slow crystal axes are respectively also mutually perpendicular. In this way, if thickness variations initially remain neglected, the two outer correcting elements 220, 222 compensate each other fully in terms of their effect on the polarization of light passing through.

As exaggeratedly represented in FIG. 6, the outer correcting elements 40 and 42 also have thickness variations which are mutually complementary in the way already described above. Owing to the fact that they are arranged on opposite sides of the correcting component 18, however, the elevations and indentations resulting therefrom cannot be brought to engage in one another. The total thickness $d_g$ of the correcting device 216 is nevertheless identical at every coordinate (x,y).

Since the birefringence axes of the correcting component formed by the two outer correcting elements 220, 222 are rotated by 45° relative to the birefringence axes of the correcting component 18, not only phase shifts but also rotations of the polarization direction can be compensated for by the correcting device 216. In order to determine the arrangement and size of the thickness variations on the individual correcting elements 20, 22, 220 and 222 in this general case, it is preferable to represent the Jones matrix for each field point and for each angle coordinate as a linear-combination of elementary matrices, which describe phase shifts and rotations of the polarization. By equating the Jones matrix represented in this way for each field point with a Jones matrix for the arrangement shown in FIG. 6, which contains only phase-shifting elements, the size of the thickness variations at the points (x,y) on the surfaces of the correcting elements can be deduced by coefficient comparison.

The reference 40 in FIG. 6 denotes, by way of example and likewise not true to scale, an additional material erosion which is present only on an outwardly facing surface 42 of the correcting element 220 and has no counterpart in the form of a corresponding elevation on the associated correcting element 222. This material erosion is used to eliminate small wavefront errors which occur during the polarization compensation. The fact that in the case of $MgF_2$, material erosion affects the wavefront about one hundred times more strongly than it affects the polarization, is utilized here.

Figure 7:
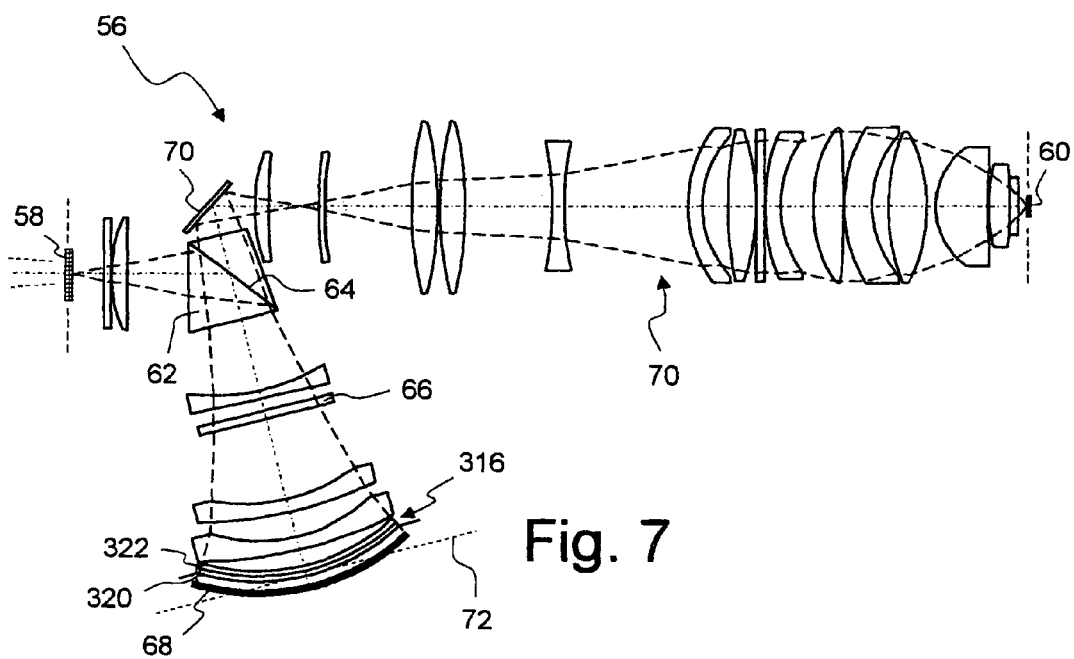
FIG. 7 shows a simplified meridian section through a catadioptric projection objective having a correcting device according to the invention.

FIG. 7 shows a catadioptric projection objective, denoted overall by 56, of a microlithographic projection exposure apparatus in a simplified meridian section. The projection objective 56 is used to project a reduced image of structures, contained in a reticle 58, onto a photosensitive surface which is applied on a substrate 60. Projection light passing through the reticle 58 enters a beam-splitter cube 62, where it is reflected by a polarization-selective beam-splitter layer 64, and is sent through a quarter-wave plate 66 and a plurality of lenses onto a spherical imaging mirror 68. After reflection by the imaging mirror 68, the polarization is again rotated in the quarter-wave plate 66 so that the projection light can now pass through the beam-splitter layer 64 and enter a purely dioptric part 70 of the projection objective 60.

The spherical imaging mirror 68 is arranged in the vicinity of a pupil plane 72 of the projection objective 60. A correcting device 316, which comprises two spherically curved correcting elements 320, 322, is arranged immediately before the imaging mirror 68, i.e. likewise in the vicinity of the pupil plane 72. The curvature ensures that the correcting device is not arranged too far away from the pupil plane 72. In this way, furthermore, the correcting device 316 has less of an effect on the wavefront profile of rays incident at large aperture angles. Since each projection light ray passes through the correcting device 316 two times, owing to the reflection by the imaging mirror 68, the thickness variations Δd can be reduced by a factor of 2 compared with an arrangement in which only a single pass takes place through the correcting element.

The invention claimed is:

1. A correcting device to compensate for perturbations of a polarization distribution over a cross section of a light beam in an optical system, comprising a correcting member which, in a given arrangement, comprises:
    a first birefringent correcting element having two substantially parallel and substantially planar surfaces, including a first surface and a further first surface, and a substantially constant first thickness in a direction perpendicular to the surfaces of the first element,
    a second birefringent correcting element having two substantially parallel and substantially planar surfaces, including a second surface and a further second surface, and a substantially constant second thickness in a direction perpendicular to the surfaces of the second element,
    wherein at least one of the first surface, the further first surface, the second surface, and the further second surface is reprocessed so as to create local thickness variations Δd by which the perturbations of the polarization distribution are compensated at least approximately, and
    wherein the arrangement, the first and the second thicknesses and birefringence properties of the first and the second correcting elements are selected so that birefringent effects within the correcting member cancel each other out at least approximately, when the local thickness variations Δd are neglected.

2. The correcting device of claim 1, wherein the correcting elements consist essentially of a same material.

3. The correcting device of claim 2, wherein the first surface and the second surface are reprocessed complementarily with one another so that a total thickness of all the correcting elements of the correcting member is constant over the cross section.

4. The correcting device of claim 3, wherein the local thickness variation Δd required for the perturbation compensation at a particular point is distributed among the first and the second correcting element so that the thickness of the first correcting element is reduced by Δd/2 at the particular point and the thickness of the second correcting element is increased by Δd/2.

5. The correcting device of claim 1, wherein the first correcting element and the second correcting element have birefringence axes that are mutually rotated by 90°.

6. The correcting device of claim 1, wherein at least one of the correcting elements has a surface which is additionally reprocessed so as to reduce wavefront errors due to the thickness variations.

7. The correcting device of claim 1, further comprising a second correcting member comprising further correcting elements, wherein the correcting elements of the one correcting member have birefringence axes that are rotated by 45° relative to birefringence axes of the further correcting elements of the second correcting member.

8. A projection objective for a microlithographic exposure apparatus, comprising the correcting device of claim 1.

9. The projection objective of claim 8, wherein the correcting device is arranged at least approximately in a pupil plane of the projection objective.

10. The projection objective of claim 9, further comprising a catadioptric part which comprises an imaging mirror, and wherein the correcting device is arranged in immediate vicinity of the imaging mirror.

* * * * *

UNITED STATES PATENT AND TRADEMARK OFFICE
CERTIFICATE OF CORRECTION

| | | |
|---|---|---|
| PATENT NO. | : 7,755,833 B2 | Page 1 of 1 |
| APPLICATION NO. | : 10/562577 | |
| DATED | : July 13, 2010 | |
| INVENTOR(S) | : Christian Hembd | |

It is certified that error appears in the above-identified patent and that said Letters Patent is hereby corrected as shown below:

Column 7, Line 19: delete "450 rotation" and insert --45° rotation--

Signed and Sealed this

Second Day of November, 2010

David J. Kappos
*Director of the United States Patent and Trademark Office*